United States Patent
Koriyama

(10) Patent No.: US 12,408,376 B2
(45) Date of Patent: Sep. 2, 2025

(54) SEMICONDUCTOR APPARATUS AND MANUFACTURING METHOD FOR SEMICONDUCTOR APPARATUS

(71) Applicant: SONY SEMICONDUCTOR SOLUTIONS CORPORATION, Kanagawa (JP)

(72) Inventor: Yushi Koriyama, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 341 days.

(21) Appl. No.: 18/003,970

(22) PCT Filed: May 19, 2021

(86) PCT No.: PCT/JP2021/019040
§ 371 (c)(1),
(2) Date: Dec. 30, 2022

(87) PCT Pub. No.: WO2022/014152
PCT Pub. Date: Jan. 20, 2022

(65) Prior Publication Data
US 2023/0261065 A1    Aug. 17, 2023

(30) Foreign Application Priority Data
Jul. 13, 2020 (JP) .................. 2020-119898

(51) Int. Cl.
*H10D 30/67* (2025.01)
*H10D 30/01* (2025.01)

(52) U.S. Cl.
CPC ....... *H10D 30/6729* (2025.01); *H10D 30/031* (2025.01); *H10D 30/673* (2025.01); *H10D 30/6758* (2025.01)

(58) Field of Classification Search
CPC ............. H10D 30/6729; H10D 30/031; H10D 30/673; H10D 30/6758; H10D 30/675;
(Continued)

(56) References Cited

U.S. PATENT DOCUMENTS

2006/0138541 A1   6/2006   Nakamura
2019/0172908 A1*  6/2019   Ikuta ............... H10D 30/65

FOREIGN PATENT DOCUMENTS

CN    110383491 A    10/2019
JP    01-204473 A    8/1989
(Continued)

OTHER PUBLICATIONS

International Search Report and Written Opinion of PCT Application No. PCT/JP2021/019040, issued on Aug. 3, 2021, 08 pages of ISRWO.

*Primary Examiner* — Mohammad A Rahman
(74) *Attorney, Agent, or Firm* — CHIP LAW GROUP

(57) ABSTRACT

Provided is a semiconductor apparatus which can achieve high reliability while reducing parasitic capacitance and can prevent a gate leakage defect while suppressing an increase in manufacturing costs. The semiconductor apparatus includes a substrate having a buried insulating film and a semiconductor layer provided on the buried insulating film and formed with a semiconductor element, a gate electrode provided on the semiconductor layer and having a wiring extending from a central portion of the semiconductor layer to each end portion of the semiconductor layer in a case where the substrate is viewed from above, a source contact via and a drain contact via which are provided on the semiconductor layer, and a protruding portion provided near an area where the end portion of the semiconductor layer intersects the wiring of the gate electrode, the protruding portion including a material identical to that of the semiconductor layer and protruding outward from a side surface (Continued)

of the semiconductor layer. At least part of the end portion of the semiconductor layer has thick film regions each having a larger film thickness than a portion of the semiconductor layer immediately below the gate electrode. The source contact via and the drain contact via are provided in areas other than the thick film regions.

11 Claims, 15 Drawing Sheets

(58) Field of Classification Search
CPC .. H10D 30/6744; H10D 30/021; H10D 30/60; H10D 30/6713; H10D 30/6745; H10D 84/0126; H10D 84/038
See application file for complete search history.

(56) References Cited

FOREIGN PATENT DOCUMENTS

| | | |
|---|---|---|
| JP | 2000-216391 A | 8/2000 |
| JP | 2007-059747 A | 3/2007 |
| JP | 2009-267027 A | 11/2009 |
| JP | 2018-148123 A | 9/2018 |
| TW | 200511588 A | 3/2005 |

\* cited by examiner

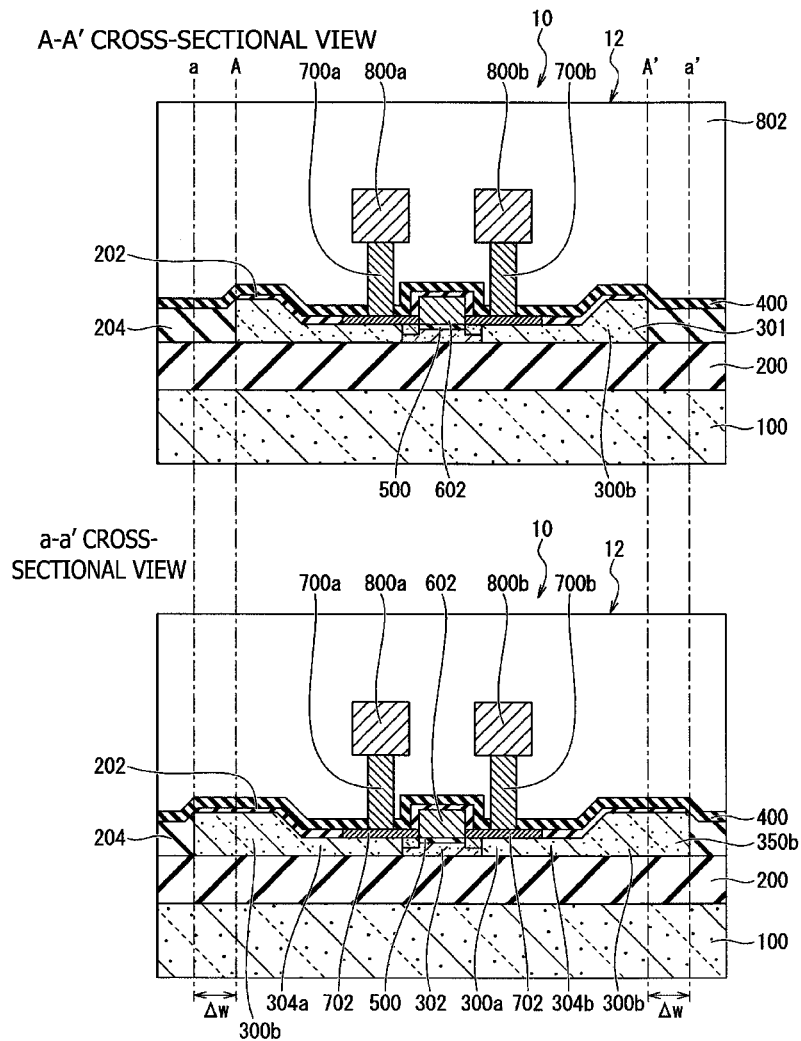

B-B' CROSS-SECTIONAL VIEW

C-C' CROSS-SECTIONAL VIEW

A-A' CROSS-SECTIONAL VIEW

A-A' CROSS-SECTIONAL VIEW

A-A' CROSS-SECTIONAL VIEW

B-B' CROSS-SECTIONAL VIEW

SEMICONDUCTOR APPARATUS AND MANUFACTURING METHOD FOR SEMICONDUCTOR APPARATUS

CROSS REFERENCE TO RELATED APPLICATIONS

This application is a U.S. National Phase of International Patent Application No. PCT/JP2021/019040 filed on May 19, 2021, which claims priority benefit of Japanese Patent Application No. JP 2020-119898 filed in the Japan Patent Office on Jul. 13, 2020. Each of the above-referenced applications is hereby incorporated herein by reference in its entirety.

TECHNICAL FIELD

The present disclosure (present technology) relates to a semiconductor apparatus and a manufacturing method for the semiconductor apparatus.

BACKGROUND ART

Communication apparatuses for use in wireless communication and the like are provided with a high-frequency antenna switch that switches among high-frequency communication signals. Such a high-frequency antenna switch is required to be a device having an insignificant parasitic capacitance and having device characteristics that are not degraded even in a case where the antenna switch handles high frequency signals.

Thus, in the related technique, for antenna switch devices, compound semiconductors such as GaAs (gallium arsenic) which have excellent high-frequency characteristics have been used. However, such compound semiconductor devices are expensive, and a device for a peripheral circuit for operating the compound semiconductor device is produced on another chip different from a chip on which the compound semiconductor device is produced. This leads to difficulty in suppressing an increase in manufacturing costs when the compound semiconductor device is incorporated into a module or the like.

Thus, in recent years, antenna switch ICs (Integrated Circuits) that use an SOI (SiliconOnInsulator) substrate enabling a device for an antenna switch and a device for a peripheral circuit to be mixedly formed on an identical chip have actively been developed. The SOI substrate refers to a substrate including a buried insulating film (BOX layer) provided on a high-resistance support substrate and a semiconductor layer (SOI layer) provided on the buried insulating film and including silicon. The use of such an SOI substrate enables a reduction in parasitic capacitance due to a depletion layer formed in a PN junction region, allowing production of a device for an antenna switch that has high-frequency characteristics less likely to be degraded and that has device characteristics equal to those of the above-described compound semiconductor. Further, in a case where a device for an antenna switch is formed with use of such an SOI substrate, a device for a peripheral circuit can mixedly be formed on the identical substrate. Note that an example of the device formed on such an SOI substrate can include a semiconductor apparatus disclosed in PTL 1 listed below.

However, the SOI layer may locally be thinned due to a treatment such as thermal oxidation or etching and polishing which is performed in a manufacturing process for a semiconductor apparatus. In such a thinned portion of the SOI layer, field concentration occurs during operation of a field effect transistor (hereinafter referred to as the FET), causing the reliability of the FET to be degraded. In addition, various measures have been taken to prevent such degradation of reliability of the FET, but these measures have sometimes increased the parasitic capacitance, degrading the high-frequency characteristics of the FET and significantly increasing the manufacturing costs.

To deal with these problems, a technology described in PTL 2 listed below has been laid open to public inspection, the technology having achieved low parasitic capacitance, high reliability, and low costs by increasing a film thickness of only end portions of the SOI layer.

CITATION LIST

Patent Literature

[PTL 1]
  JP 2000-216391A
[PTL 2]
  JP 2018-148123A

SUMMARY

Technical Problem

However, even with the above-described technology, the FET with an increased size causes CMP (Chemical Mechanical Polishing) damage on a silicon (Si) layer when STI (Shallow Trench Isolation) is formed, leading to a gate leakage defect.

In view of these circumstances, an object of the present disclosure is to provide a semiconductor apparatus that can achieve high reliability while reducing the parasitic capacitance and can prevent a gate leakage defect while suppressing an increase in manufacturing costs and to provide a manufacturing method for the semiconductor apparatus.

Solution to Problem

An aspect of the present disclosure provides a semiconductor apparatus including a substrate having a buried insulating film and a semiconductor layer provided on the buried insulating film and formed with a semiconductor element, a gate electrode provided on the semiconductor layer and having a wiring extending from a central portion of the semiconductor layer to each end portion of the semiconductor layer in a case where the substrate is viewed from above, a source contact via and a drain contact via which are provided on the semiconductor layer, and a protruding portion provided near an area where the end portion of the semiconductor layer intersects the wiring of the gate electrode, the protruding portion including a material identical to that of the semiconductor layer and protruding outward from a side surface of the semiconductor layer, in which at least part of the end portion of the semiconductor layer has thick film regions each having a larger film thickness than a portion of the semiconductor layer immediately below the gate electrode, and the source contact via and the drain contact via are provided in areas other than the thick film regions.

Another aspect of the present disclosure provides a manufacturing method for a semiconductor apparatus, the manufacturing method including forming a gate electrode on a semiconductor layer provided on a buried insulating film and formed with a semiconductor element, the gate electrode having a wiring extending from a central portion of the semiconductor layer to end portions of the semiconductor layer in a case where a substrate having the buried insulating film and the semiconductor layer is viewed from above, forming protruding portions each located near an area where the end portion of the semiconductor layer intersects the wiring of the gate electrode, the protruding portion including a material identical to that of the semiconductor layer and protruding outward from a side surface of the semiconductor layer, and setting the end portions of the semiconductor layer larger in film thickness than a portion of the semiconductor layer immediately below the gate electrode.

BRIEF DESCRIPTION OF DRAWINGS

FIG. 2 illustrates cross-sectional views of the semiconductor apparatus depicted in FIGS. 1A and 1B, the cross-sectional views being taken along lines A-A' and a-a'.

DESCRIPTION OF EMBODIMENTS

Embodiments of the present disclosure will be described below with reference to the drawings. In the illustration of the drawings referred to in the description below, identical or similar portions are denoted by identical or similar reference signs, and duplicate descriptions are omitted. However, it should be noted that the drawings are schematic and that the relation between thickness and planar dimensions, the ratio of the thicknesses of apparatuses and members, and the like differ from the real relation, ratio, and the like. Consequently, specific thicknesses and dimensions should be determined in consideration of the description below. In addition, it is obvious that some of the dimensional relation and the ratios vary among the drawings.

In the present specification, a "first conductivity type" refers to one of a p-type or an n-type, whereas a "second conductivity type" means one of the p-type or the n-type that is different from the "first conductivity type." In addition, "+" or "−" added to "n" and "p" means that a semiconductor region with "+" or "−" has a high or low impurity density relative to a semiconductor region without "+" or "−." However, semiconductor regions with the same "n" do not mean that the semiconductor regions have exactly the same impurity density.

In addition, the definition of directions such as up and down in the following description is only for convenience of description and is not intended to limit the technical concepts of the present disclosure. For example, it is obvious that observing a target by rotating the target through 90° converts the up-down direction into the lateral direction and observing the target by rotating the target through 180° inverts the up-down direction.

Note that effects described herein are only illustrative and are not restrictive and that the present disclosure may produce other effects.

First Embodiment

<Planar Configuration>

Figure 1A:
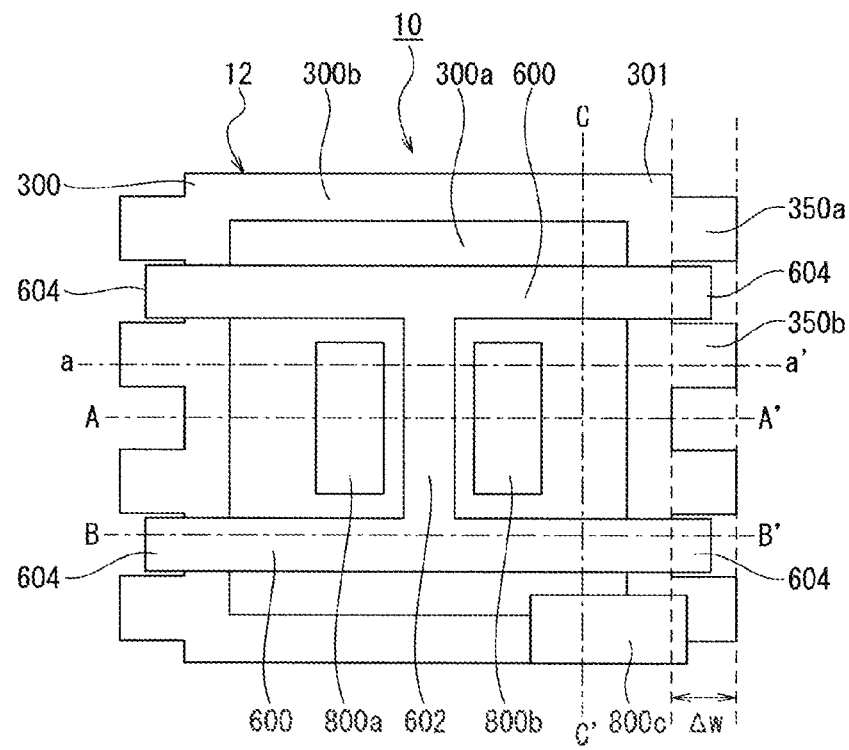
FIGS. 1A and 1B illustrate plan views of a semiconductor apparatus according to a first embodiment of the present disclosure.
Figure 1B:
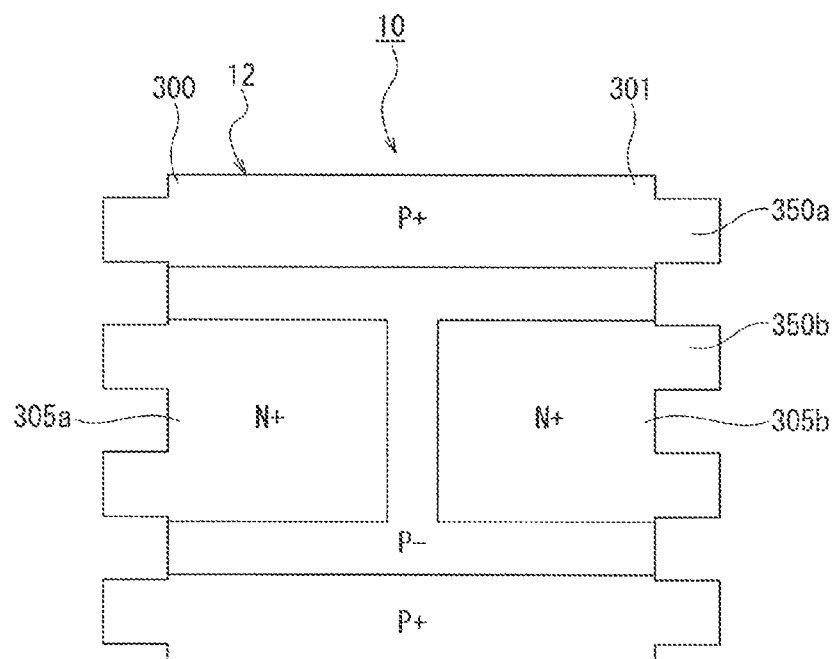

FIGS. 1A and 1B are plan views of a semiconductor apparatus 10 according to a first embodiment of the present disclosure. Note that, in the present first embodiment described below, a transistor 12 is assumed to be an n-type MOS-FET and to have an H-shaped gate electrode structure as a planar structure. However, the transistor 12 in the present first embodiment is not limited to such an example and may be a transistor having another configuration.

In the semiconductor apparatus 10 according to the present first embodiment, a buried insulating film 200 (see FIGS. 2 to 4) is provided on a silicon support substrate 100 including high-resistance silicon with a resistivity of 500 Ωcm or more, and an impurity diffusion layer (semiconductor layer) 300 is provided on the buried insulating film 200.

The impurity diffusion layer 300 is provided with the transistor 12. Specifically, as depicted in FIG. 1A, The impurity diffusion layer 300 has two gate electrode wiring portions 600 and a gate electrode portion 602 constituting a gate electrode, a source electrode 800a, a drain electrode 800b, and a body contact electrode 800c provided thereon. The two gate electrode wiring portions 600 and the gate electrode portion 602 provided on the impurity diffusion layer 300 include polysilicon, and have a laterally brought-down H shape as viewed from above the silicon support substrate 100. Specifically, the gate electrode portion 602 is a rectangular electrode portion located in the center in FIG. 1A and extending along an up-down direction in FIG. 1A. Further, the two gate electrode wiring portions 600 are two band-like wiring portions extending in the lateral direction in FIG. 1A and interposing the gate electrode portion 602 between the gate electrode wiring portions 600 in the up-down direction in FIG. 1A, the gate electrode portion 602 being located in the central portion and shaped like a rectangle. In addition, the two gate electrode wiring portions 600 are connected to the above-described gate electrode portion 602 in the center.

Further, as depicted in FIG. 1A, in the present embodiment, the gate electrode wiring portion 600 extends on the impurity diffusion layer 300 along the lateral direction in FIG. 1A from a central portion of the impurity diffusion layer 300. The gate electrode wiring portion 600 further extends across an end portion 301 of the transistor 12 along each of the rightward direction and the leftward direction in FIG. 1A to form a gate electrode wiring lead-out portion 604.

In addition, the source electrode 800a and the drain electrode 800b, each including a metal film, are provided interposing the gate electrode portion 602 that is located in the center of the impurity diffusion layer 300 between the source electrode 800a and the drain electrode 800b in the lateral direction. The source electrode 800a and the drain electrode 800b function as wires connected to a source region and a drain region of the transistor 12.

Then, the impurity diffusion layer 300 includes a silicon layer into which desired impurities are doped. Specifically, as depicted in FIG. 1B, a source N+ region 305a and a drain N+ region 305b in which n-type impurities such as phosphorus or arsenic are diffused are formed below and around the source electrode 800a and the drain electrode 800b of the impurity diffusion layer 300, and p-type impurities such as boron are diffused in the other areas of the impurity diffusion layer 300.

In addition, as depicted in the lower right of FIG. 1A, the lower right of the impurity diffusion layer 300 is provided with the body contact electrode 800c. To suppress a substrate floating effect, the body contact electrode 800c is used as a wire for fixing and controlling a potential of the impurity diffusion layer 300.

In addition, an STI 204 (see FIGS. 2 to 4) in which an insulating film such as a silicon oxide film is buried is provided surrounding the periphery of the impurity diffusion layer 300. The STI 204 isolates the transistor 12 provided in the impurity diffusion layer 300 from other elements provided on the silicon support substrate 100.

In the present first embodiment, two protruding portions 350a and 350b are formed near a portion in which the gate electrode wiring portion 600 intersects the end portion 301 of the transistor 12 of the impurity diffusion layer 300, the protruding portions 350a and 350b each including a part of the impurity diffusion layer 300 and protruding outward from a side surface of the impurity diffusion layer 300 including a silicon layer 320 of the semiconductor substrate.

<Cross-Sectional Configuration>

Figure 3:
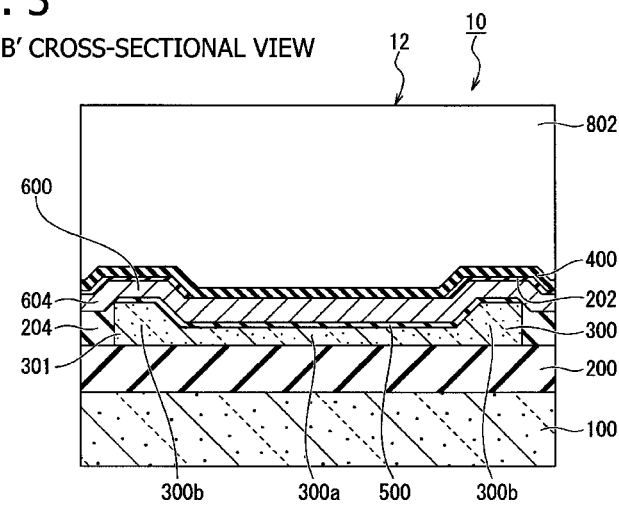
FIG. 3 is a cross-sectional view of the semiconductor apparatus depicted in FIGS. 1A and 1B, the cross-sectional view being taken along line B-B'.
Figure 4:
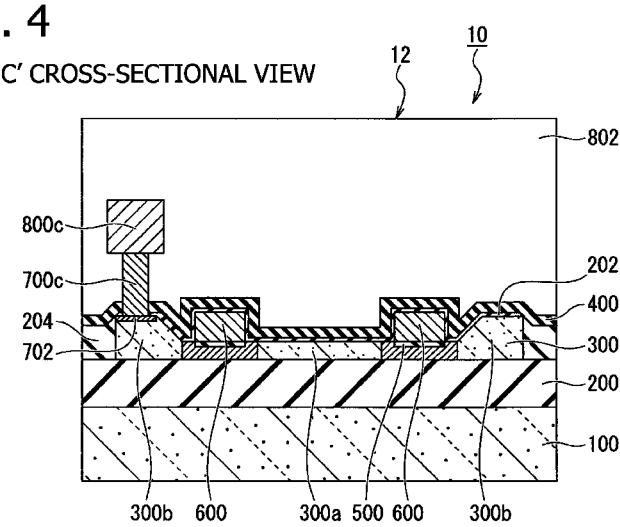
FIG. 4 is a cross-sectional view of the semiconductor apparatus depicted in FIGS. 1A and 1B, the cross-sectional view being taken along line C-C'.

Now, a cross-sectional configuration of the semiconductor apparatus 10 in the present first embodiment will be described with reference to FIGS. 2 to 4. FIG. 2 illustrates cross-sectional views of the semiconductor apparatus 10 depicted in FIG. 1A, the cross-sectional views being taken along lines A-A' and a-a'. FIG. 3 is a cross-sectional view of the semiconductor apparatus 10 depicted in FIG. 1A, the cross-sectional view being taken along line B-B'. Further, FIG. 4 is a cross-sectional view of the semiconductor apparatus 10 depicted in FIG. 1A, the cross-sectional view being taken along line C-C'.

As depicted in FIG. 2, the semiconductor apparatus 10 according to the present first embodiment includes the buried insulating film 200 including a silicon oxide film and provided on the silicon support substrate 100 including high-resistance silicon, as described above. Further, the semiconductor apparatus 10 includes the impurity diffusion layer 300 including a silicon layer and provided on the buried insulating film 200. In other words, in the present first embodiment, the above-described SOI substrate is used as a substrate, and the impurity diffusion layer 300 corresponds to the above-described SOI layer. In the present first embodiment, the use of the SOI substrate enables a parasitic capacitance in the transistor 12 to be reduced. Note that a back surface of the silicon support substrate 100 may be ground to form the silicon support substrate 100 into a thin film after manufacture of the semiconductor apparatus 10 and that the film thickness of the silicon support substrate 100 is not particularly limited. In addition, the buried insulating film 200 has a film thickness of approximately from 100 nm to 2000 nm and preferably has a film thickness of approximately 400 nm in consideration of the high frequency property of the transistor 12.

As depicted in FIG. 2, the impurity diffusion layer 300 includes a thin film portion 300a located in a central portion of the impurity diffusion layer 300 and having a small film thickness, and thick film portions 300b located at the end portions 301 of the transistor 12 and having a larger film thickness than the thin film portion 300a. In addition, the impurity diffusion layer 300 includes the thick film portion 300b in each of the protruding portions 350a and 350b (only the protruding portion 350b is depicted in FIG. 2), the thick film portion 300b having the same film thickness as the end portion 301 of the transistor 12. The protruding portions 350a and 350b protrude, for example, 0.4 μm or more (denoted by ΔW in FIG. 2) from the end portion 301 of the transistor 12 of the impurity diffusion layer 300.

Figure 19:
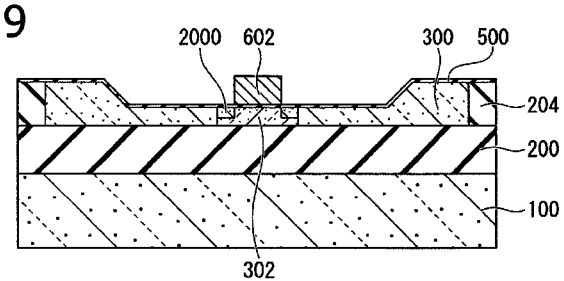
FIG. 19 is a cross-sectional view (15) illustrating each process in the manufacturing method for the semiconductor apparatus according to the first embodiment of the present disclosure.
Figure 20:
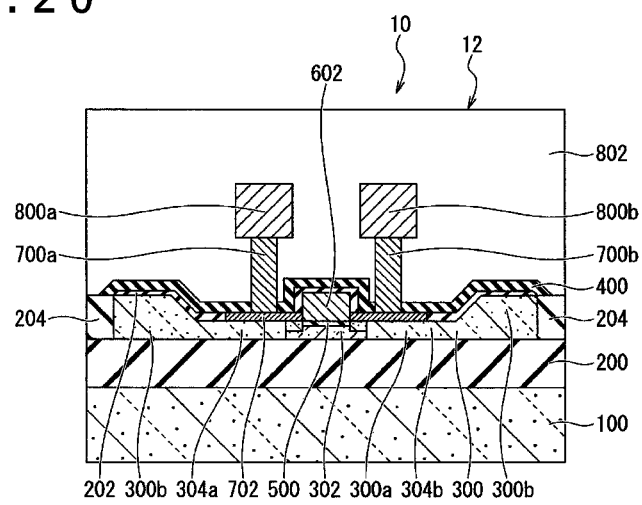
FIG. 20 is a cross-sectional view (16) illustrating each process in the manufacturing method for the semiconductor apparatus according to the first embodiment of the present disclosure.

The central portion of the thin film portion 300a located below the gate electrode portion 602 corresponds to a gate region 302 of the transistor 12 in which p-type impurities are diffused. In addition, areas of the thin film portion 300a interposing the gate region 302 between the areas correspond to a source region 304a and a drain region 304b in each of which n-type impurities are diffused. Note that portions of the source region 304a and the drain region 304b which are adjacent to the gate region 302 desirably form an LDD layer 2000 having a lower impurity concentration than portions of the source region 304a and the drain region 304b which are located away from the gate region 302. This will be described in detail with reference to FIG. 19.

In addition, the thick film portion 300b located at the end portion 301 of the impurity diffusion layer 300 is thicker than the thin film portion 300a located at the central portion of the impurity diffusion layer 300, and specifically has a film thickness twice to ten times as large as the film thickness of the thin film portion 300a. More specifically, in view of compatibility between the high frequency property and the reliability of the transistor 12, the thick film portion 300b preferably has a film thickness of 140 nm to 200 nm, and the thin film portion 300a preferably has a film thickness of 20 nm to 70 nm.

Note that, in the plan view of FIG. 1A described above, the thin film portion located in the central portion of the impurity diffusion layer 300 is denoted by 300a, whereas the thick film portion located at the end portion 301 of the impurity diffusion layer 300 is denoted by 300b.

Further, in the semiconductor apparatus 10 according to the present embodiment, a gate insulating film 500 is provided on the gate region 302 provided in the central portion of the impurity diffusion layer 300. The gate insulating film 500 includes a silicon oxide film, and any film thickness can be selected for the gate insulating film 500.

In addition, two silicide films 702 spaced apart from the gate region 302 are provided on respective upper surfaces of the impurity diffusion layer 300 located on both sides of the gate region 302. Further, a source contact via 700a and the source electrode 800a are provided on one of the silicide films 702, and a drain contact via 700b and the drain electrode 800b are provided on the other of the silicide films 702. In other words, the source contact via 700a and the drain contact via 700b are respectively provided on the source region 304a and the drain region 304b formed in the thin film portion 300a of the impurity diffusion layer 300. The gate electrode portion 602 is provided being interposed between the source region 304a and the drain region 304b. The source contact via 700a and the drain contact via 700b provided on the thin film portion 300a enable the parasitic capacitance between the source and the drain to be reduced. Note that the silicide film 702 is a compound film including silicon and other elements and that the source contact via 700a, the drain contact via 700b, the source electrode 800a, and the drain electrode 800b each include a metal film or the like. Note that, in the present first embodiment, for the source region 304a, the drain region 304b, the silicide film 702, the source contact via 700a, the drain contact via 700b, the source electrode 800a, and the drain electrode 800b, the film thickness, the size, the shape, and the like are not particularly limited. In addition, in the present first embodiment, the transistor 12 is preferably laid out in consideration of a manufacturing variation in order to maintain a high manufacturing yield of the semiconductor apparatus 10.

Note that, in the above description, to reduce the parasitic capacitance between the source and the drain, the source contact via 700a and the drain contact via 700b are provided on the thin film portion 300a of the impurity diffusion layer 300.

In addition, the STI (isolation insulating film) 204 is provided around the impurity diffusion layer 300 in order to isolate the transistor 12 from the other elements. In particular, the STI 204 includes a trench provided surrounding the periphery of the impurity diffusion layer 300 and a silicon oxide film buried in the trench. Note that, in the present embodiment, the width, the depth, the shape, and the like of the trench of the STI 204 are not particularly limited.

In addition, the silicon oxide film 202 is provided covering the gate electrode portion 602, the impurity diffusion layer 300, and the STI 204. Further, a further silicon nitride film 400 is provided covering the above-described silicon oxide film 202. In addition, on the silicon nitride film 400, a silicon oxide film 802 is provided between the source contact via 700a and the drain contact via 700b and between the source electrode 800a and the drain electrode 800b. Note that, in the present first embodiment, for the silicon oxide film 202, the silicon nitride film 400, and the silicon oxide film 802, the material, the film thickness, and the like are not particularly limited.

Now, with reference to FIG. 3, the semiconductor apparatus 10 according to the present first embodiment will be described. As described above, also in this cross-sectional view, the semiconductor apparatus 10 includes the silicon support substrate 100, the buried insulating film 200 provided on the silicon support substrate 100, and the impurity diffusion layer 300 provided on the buried insulating film 200.

Also in the cross section of FIG. 3, as is the case with the cross section of FIG. 2, the impurity diffusion layer 300 includes the thin film portion 300a located at the central portion and having a small film thickness and the thick film portions 300b located at the respective end portions 301 of the transistor 12 and having a large film thickness. In particular, also in this cross section, the thick film portion 300b has a film thickness twice to ten times as large as the film thickness of the thin film portion 300a. More specifically, the thick film portion 300b preferably has a film thickness of 140 nm to 200 nm, and the thin film portion 300a preferably has a film thickness of 20 nm to 70 nm.

In addition, in the cross section of FIG. 3, the gate electrode wiring portion 600 is provided on the thin film portion 300a and the thick film portion 300b of the impurity diffusion layer 300 via the gate insulating film 500. As depicted in FIG. 3, the gate electrode wiring portion 600 extends on the impurity diffusion layer 300 in the lateral direction in FIG. 3 and further extends across the end portion 301 of the transistor 12 in each of the rightward direction and the leftward direction in FIG. 3 to form the gate electrode wiring lead-out portion 604. In other words, the gate electrode wiring portion 600 is provided to pass over the thick film portions 300b of the impurity diffusion layer 300 as well as over the thin film portion 300a of the impurity diffusion layer 300.

Now, with reference to FIG. 4, the semiconductor apparatus 10 according to the present first embodiment will be described. The cross section is obtained by cutting the body contact electrode 800c in such a manner as to traverse the body contact electrode 800c. As described above, also in this cross-sectional view, the semiconductor apparatus 10 includes the silicon support substrate 100, the buried insulating film 200 provided on the silicon support substrate 100, and the impurity diffusion layer 300 provided on the buried insulating film.

In the cross section of FIG. 4 as well, as is the case with the cross section of FIG. 2, the impurity diffusion layer 300 includes the thin film portion 300a located in the central portion and having a small film thickness and the thick film portions 300b located at the respective end portions 301 of the transistor 12 and having a large film thickness. Specifically, also in this cross section, the thick film portion 300b has a film thickness twice to ten times as large as the film thickness of the thin film portion 300a. More specifically, the thick film portion 300b preferably has a film thickness of 140 nm to 200 nm, and the thin film portion 300a preferably has a film thickness of 20 nm to 70 nm.

In addition, also in the cross section of FIG. 4, the gate electrode wiring portions 600 are provided on the thin film portion 300a of the impurity diffusion layer 300 via the gate insulating film 500.

Further, as depicted in the left of FIG. 4, a body contact via 700c and the body contact electrode 800c are provided on the thick film portion 300b via the silicide film 702. Note that, as described above, the silicide film 702 is a compound film of silicon and other elements, and the body contact via 700c and the body contact electrode 800c each include a metal film or the like. Note that, in the present first embodiment, for the silicide film 702, the body contact via 700c, and the body contact electrode 800c, the film thickness, the size, the shape, and the like are not particularly limited.

As described above, the source contact via 700a and the drain contact via 700b are provided on the thin film portion 300a of the impurity diffusion layer 300. This reduces the parasitic capacitance between the source and the drain. On the other hand, the body contact via 700c is provided on the thick film portion 300b of the impurity diffusion layer 300. The parasitic capacitance between the body (impurity diffusion layer 300) and the gate only insignificantly affects the high-frequency property of the transistor 12, and thus the body contact via 700c may be provided on the thick film portion 300b of the impurity diffusion layer 300.

<Manufacturing Method for Semiconductor Apparatus>

Now, a manufacturing method for the semiconductor apparatus 10 will be described.

Figure 5:
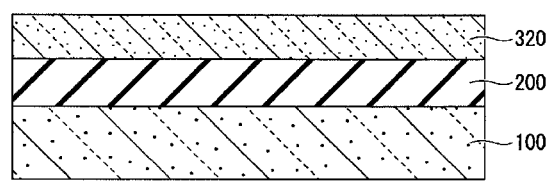
FIG. 5 is a cross-sectional view (1) illustrating a process in a manufacturing method for a semiconductor apparatus according to a first embodiment of the present disclosure.

First, as depicted in FIG. 5, the manufacturing method according to the present embodiment uses an SOI substrate including the silicon support substrate 100, the buried insulating film 200 including a silicon oxide film and having a film thickness of 100 nm to 2000 nm, preferably 400 nm, and further the silicon layer 320 provided on the buried insulating film 200 and having a film thickness of 30 nm to 400 nm, preferably 175 nm.

Figure 6:
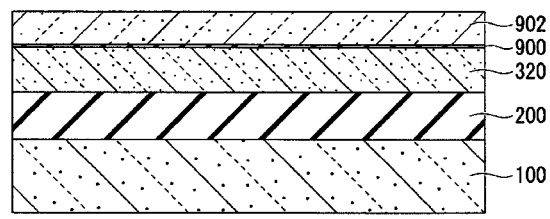
FIG. 6 is a cross-sectional view (2) illustrating a process in the manufacturing method for the semiconductor apparatus according to the first embodiment of the present disclosure.

Then, as depicted in FIG. 6, an oxidation treatment is performed on an upper surface of the silicon layer 320 to form a silicon oxide film 900 having a film thickness of 10 nm to 100 nm, preferably 10 nm. Note that a method for the above-described oxidation treatment is not particularly limited and that known various methods for an oxidation treatment can be used. Further, a silicon nitride film 902 having a film thickness of 10 nm to 300 nm, preferably 100 nm, is formed on the silicon oxide film 900 by CVD (Chemical Vapor Deposition).

Figure 7:
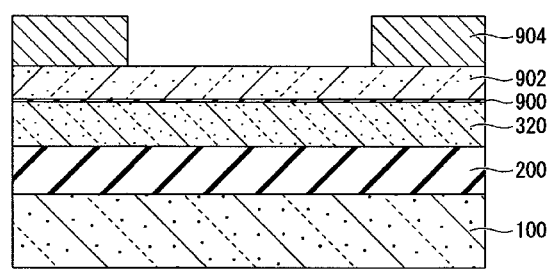
FIG. 7 is a cross-sectional view (3) illustrating a process in the manufacturing method for the semiconductor apparatus according to the first embodiment of the present disclosure.

Then, as depicted in FIG. 7, resist is applied all over the surface of the silicon nitride film 902, and is exposed through photolithography to form a resist pattern 904. The resist pattern 904 has a pattern including an opening in an area of the silicon layer 320 that is to have a reduced film thickness. The pattern is preferably a layout pattern designed in such a manner that the area where the film thickness located between the thin film portion (corresponding to the thin film portion 300a described above) and the thick film portion 300b (corresponding to the thick film portion 300b described above) of the silicon layer 320 gradually varies has a length of approximately 400 nm, that is, the distance between the thin film portion and the thick film portion is approximately 400 nm.

Figure 8:
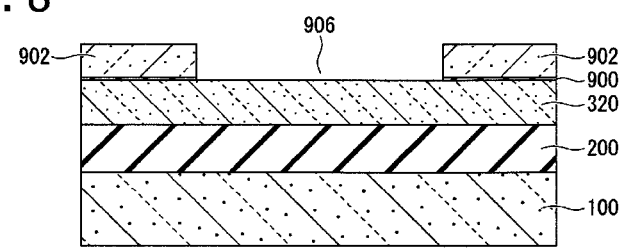
FIG. 8 is a cross-sectional view (4) illustrating a process in the manufacturing method for the semiconductor apparatus according to the first embodiment of the present disclosure.

Subsequently, the resist pattern 904 is used as a mask to perform a dry etching treatment on the silicon nitride film 902 and the silicon oxide film 900. In this manner, as depicted in FIG. 8, after an opening 906 corresponding to a partly exposed upper surface of the silicon layer 320 is obtained, the resist pattern 904 is removed. Note that, when the dry etching treatment is performed on the silicon oxide film 900, the upper surface of the silicon layer 320 exposed from the opening 906 may be partly etched.

Figure 9:
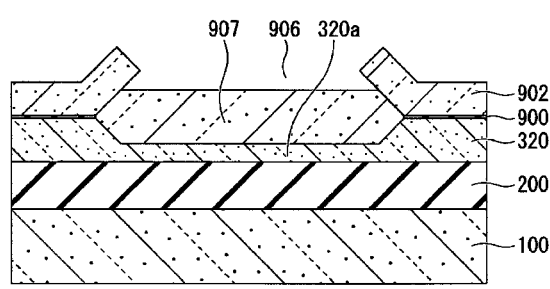
FIG. 9 is a cross-sectional view (5) illustrating a process in the manufacturing method for the semiconductor apparatus according to the first embodiment of the present disclosure.

Then, as depicted in FIG. 9, a selective oxidation treatment (LOCal Oxidation of Silicon; LOCOS oxidation treatment) is performed on a part of the silicon layer 320 exposed from the opening 906. At this time, the amount of oxidation by which the silicon layer 320 is oxidized by the oxidation treatment is controlled in such a manner that the silicon layer 320 located at the opening 906 has a desired film thickness. More specifically, in a case where the film thickness of the central portion 320a of the silicon layer 320 (that is, the film thickness of the thin film portion 300a of the impurity diffusion layer 300) is finally 60 nm, then in the process in FIG. 9, the amount of oxidation is preferably controlled to set the film thickness of the silicon layer 320 located at the opening 906 to approximately 80 nm. This causes the silicon layer 320 to be partly thinned.

Figure 10:
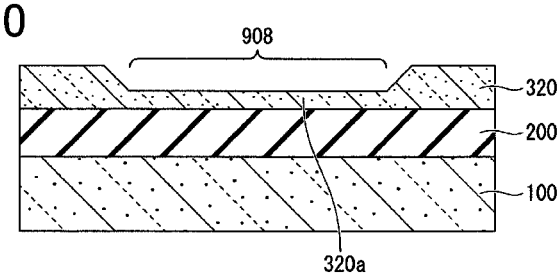
FIG. 10 is a cross-sectional view (6) illustrating a process in the manufacturing method for the semiconductor apparatus according to the first embodiment of the present disclosure.

Subsequently, when the silicon nitride film 902 is removed with phosphoric acid and the silicon oxide film 900 is further removed with hydrofluoric acid or the like, the silicon layer 320 can be obtained that includes a silicon thin film portion 908 corresponding to the silicon layer 320 partly thinned as depicted in FIG. 10.

Figure 11A:
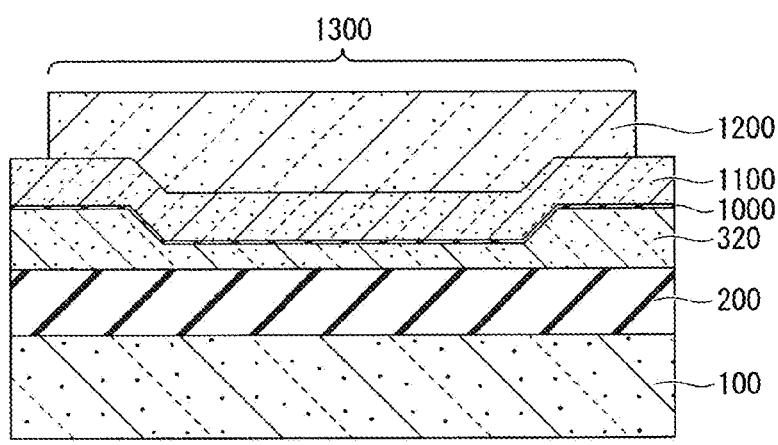
FIGS. 11A and 11B depict a cross-sectional view FIG. 11A and a plan view FIG. 11B (7) illustrating a process in the manufacturing method for the semiconductor apparatus according to the first embodiment of the present disclosure.

Further, as depicted in FIG. 11A, the oxidation treatment is performed on the upper surface of the silicon layer 320 to form a silicon oxide film 1000 having a film thickness of 10 nm to 100 nm, preferably 10 nm. Further, a silicon nitride film 1100 having a film thickness of 10 nm to 400 nm, preferably 210 nm is formed on the silicon oxide film 1000 by CVD. Then, resist is applied all over the surface of the silicon nitride film 1100, and is exposed by photolithography to form a resist pattern 1300. The resist pattern 1300 has a pattern including an opening at a position where the STI 204 for separating the transistor 12 from the other elements is formed.

Figure 11B:
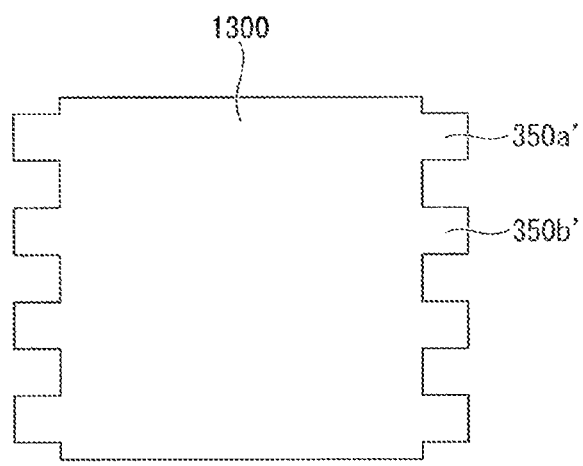

As depicted in FIG. 11B, the resist pattern 1300 includes the resist pattern 1300 for element isolation including resist patterns 350a' and 350b' with protruding portions in such a manner that silicon that is located near the areas where the end portion 301 of the transistor 12 and the gate electrode wiring portions 600 intersect protrudes. This configuration suppresses an increase in the number of processes for photolithography.

Figure 12:
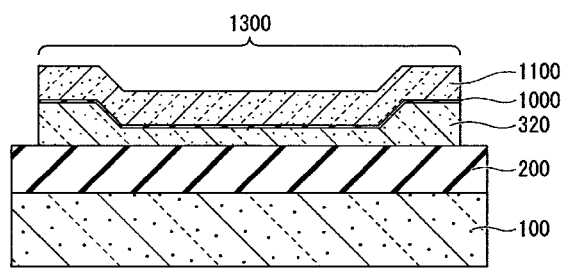
FIG. 12 is a cross-sectional view (8) illustrating each process in the manufacturing method for the semiconductor apparatus according to the first embodiment of the present disclosure.

Subsequently, the dry etching treatment is performed on the silicon nitride film 1100 and the silicon oxide film 1000 with the resist pattern 1300 used as a mask. Further, the upper surface of the silicon layer 320 is exposed in areas that are not covered with the resist pattern 1300, and then the resist pattern 1300 is removed. Note that, in the present first embodiment, a method for removing the resist pattern 1300 is not particularly limited and that known various removal methods such as asking can be used. Then, a structure depicted in FIG. 12 can be obtained by using the dry etching treatment under conditions different from those described above to etch the silicon layer 320 with the silicon nitride film 1100 used as a mask.

Figure 13:
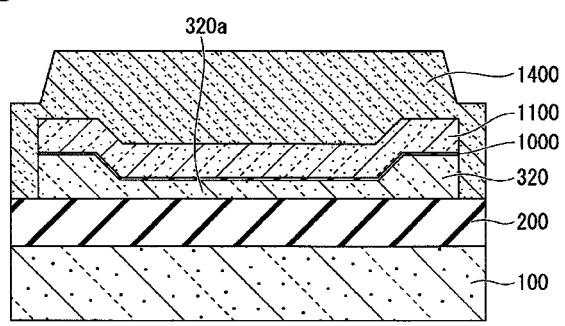
FIG. 13 is a cross-sectional view (9) illustrating each process in the manufacturing method for the semiconductor apparatus according to the first embodiment of the present disclosure.

Subsequently, as depicted in FIG. 13, HDP (High Density Plasma) or the like is used to form a silicon oxide film 1400 entirely above the silicon support substrate 100 in such a manner that trenches respectively provided on both sides of the silicon layer 320 are filled with the silicon oxide film 1400. At this time, the silicon oxide film 1400 may be formed to cover an upper surface of the silicon nitride film 1100, and the silicon oxide film 1400 has a film thickness of from 50 nm to 1000 nm, preferably 400 nm.

Then, resist is applied all over the surface of the silicon oxide film 1400 and is exposed by photolithography to form a resist film 1500. The resist film 1500 has a pattern including an opening 1600 in an area corresponding to portions of the silicon oxide film 1400 and the silicon nitride film 1100 which are located on the central portion 320a of the silicon layer 320 and which are to be removed. At this time, the opening 1600 spreads above the central portion 320a of the silicon layer 320 and preferably further spreads to the thick film portions of the silicon layer 320 located at respective end portions 320b of the silicon layer 320 and having a large film thickness.

Figure 14:
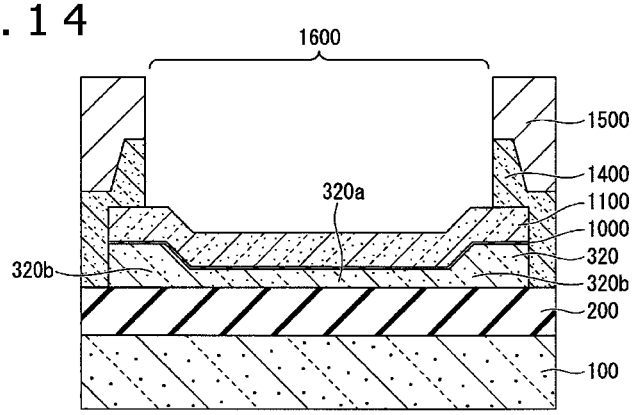
FIG. 14 is a cross-sectional view (10) illustrating each process in the manufacturing method for the semiconductor apparatus according to the first embodiment of the present disclosure.

Then, the dry etching treatment is performed on the silicon oxide film 1400 with the resist film 1500 used as a mask to remove the silicon oxide film 1400. This allows a structure depicted in FIG. 14 to be obtained. Note that, depending on conditions for CMP (Chemical Mechanical Polishing) to be performed later, the silicon oxide film 1400 may remain in the central portion 320a and in an area between the central portion 320a and the end portion 320b where the film thickness of the silicon layer 320 gradually varies. Thus, to prevent the silicon oxide film 1400 from remaining, the above-described dry etching treatment is preferably performed under overetching conditions of such an extent that the silicon nitride film 1100 is also etched.

Figure 15:
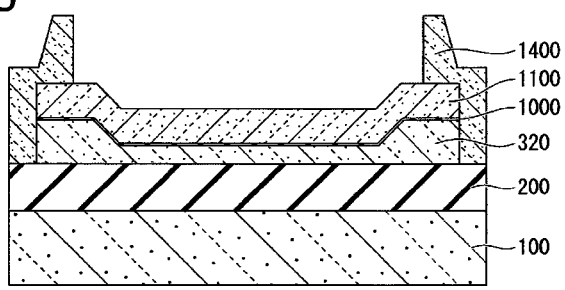
FIG. 15 is a cross-sectional view (11) illustrating each process in the manufacturing method for the semiconductor apparatus according to the first embodiment of the present disclosure.

Then, as depicted in FIG. 15, the resist film 1500 is removed.

Figure 16:
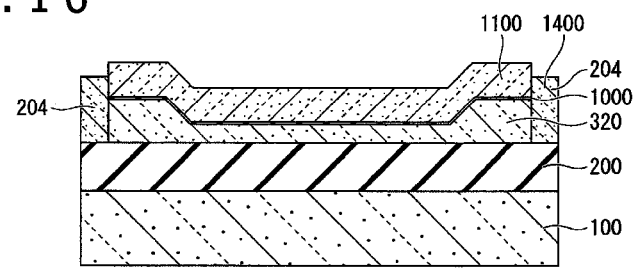
FIG. 16 is a cross-sectional view (12) illustrating each process in the manufacturing method for the semiconductor apparatus according to the first embodiment of the present disclosure.

Further, a structure depicted in FIG. 16 can be obtained by performing a planarization treatment on the upper surface of the silicon support substrate 100 by CMP. Note that the planarized silicon oxide film 1400 forms the STI 204 for element isolation.

Figure 17:
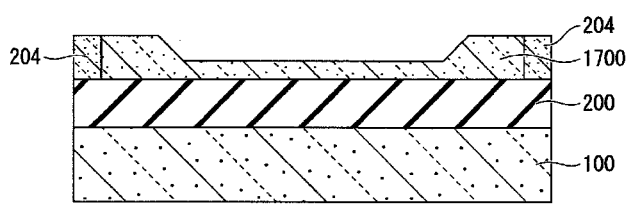
FIG. 17 is a cross-sectional view (13) illustrating each process in the manufacturing method for the semiconductor apparatus according to the first embodiment of the present disclosure.

Subsequently, the silicon nitride film 1100 is removed with phosphoric acid, and the silicon oxide film 1000 is further removed with hydrofluoric acid or the like. Then, a transistor formation region 1700 as depicted in FIG. 17 can be obtained. Here, for example, ion implantation may be used to dope impurities into the transistor formation region 1700 as necessary. At this time, an upper surface of the transistor formation region 1700 is covered with patterned resist, and impurities may be doped into a desired portion of the transistor formation region 1700.

Figure 18:
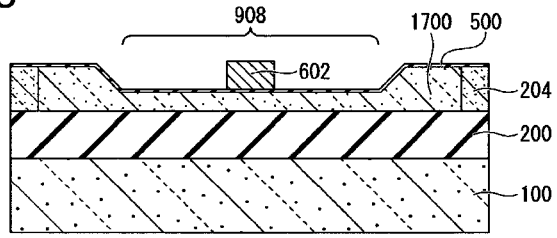
FIG. 18 is a cross-sectional view (14) illustrating each process in the manufacturing method for the semiconductor apparatus according to the first embodiment of the present disclosure.

Further, the gate insulating film 500 including a silicon oxide film is formed on the transistor formation region 1700 and the STI 204. In addition, as depicted in FIG. 18, a polysilicon film is formed all over the surface of the gate insulating film 500, and is patterned into any shape by etching or the like to form the gate electrode portion 602.

Subsequently, ion implantation may be used to dope impurities into the transistor formation region 1700 with the gate electrode portion 602 used as a mask to form the impurity diffusion layer 300. Further, impurities are doped around the gate region 302 of the impurity diffusion layer 300 to achieve an impurity concentration lower than that achieved with the above-described ion implantation, thus forming an LDD (Lightly Doped Drain) layer 2000 in the impurity diffusion layer 300. This allows a structure depicted in FIG. 19 to be obtained. Note that the above-described ion implantation may be performed after formation of the LDD layer 2000.

Further, etching is performed with the gate electrode portion 602 used as a mask to pattern the gate insulating film 500. Subsequently, the silicide films 702 may be formed on the exposed upper surface of the impurity diffusion layer 300 at positions spaced apart from the gate electrode portion 602 and on both sides of the gate electrode portion 602. Note that, in the present embodiment, a method for forming the above-described silicide films 702 is not particularly limited and that known various formation methods can be used.

Subsequently, the silicon oxide film 202, the silicon nitride film 400, and the silicon oxide film 802 are sequentially formed on the impurity diffusion layer 300, the STI 204, and the gate electrode portion 602. Then, the source contact via 700a and the drain contact via 700b each of which extends from the silicon oxide film 802, penetrates the silicon nitride film 400 and the silicon oxide film 202, and reaches the silicide film 702 are formed. At this time, in the present embodiment, the source contact via 700a and the drain contact via 700b can be provided on a wide thin film portion 300a away from each other at a predetermined distance. This enables accurate patterning of the source contact via 700a and the drain contact via 700b to be avoided, allowing a decrease in manufacturing yield to be avoided. In addition, since the source contact via 700a and the drain contact via 700b can be spaced apart from each other at the predetermined distance, particularly in a transistor with a plurality of gates, an increase in the layout size of the transistor can be suppressed, thus allowing an increase in manufacturing costs to be suppressed.

Further, the source electrode 800a is formed on the source contact via 700a, and the drain electrode 800b is formed on the drain contact via 700b. At this time, methods for forming the silicon oxide film 202, the silicon nitride film 400, the silicon oxide film 802, the source contact via 700a, the drain contact via 700b, the source electrode 800a, and the drain electrode 800b are not particularly limited, and formation methods commonly used in a manufacturing method for the semiconductor apparatus 10 can be used. Further, a further metal film may be formed on the source electrode 800a and the drain electrode 800b. As described above, the semiconductor apparatus 10 according to the embodiment of the present disclosure depicted in FIGS. 1A, 1B, 2, 3, and 4 can be obtained.

Comparative Example of Embodiment

Figure 21:
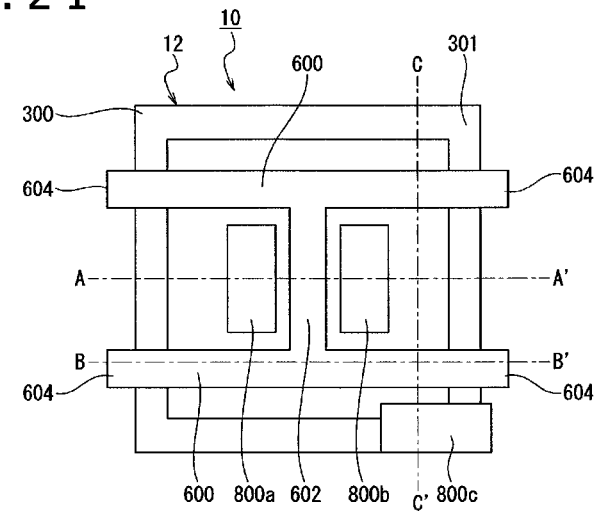
FIG. 21 is a plan view of a semiconductor apparatus according to Comparative Example.

FIG. 21 depicts a plan view of the semiconductor apparatus 10 as Comparative Example. Note that identical portion in FIGS. 21, 1A, and 1B described above are denoted by identical reference signs, and detailed descriptions of these portions are omitted.

In Comparative Example, the film thickness of the impurity diffusion layer 300 is increased only at the end portions 301 of the impurity diffusion layer 300, thus achieving low parasitic capacitance, high reliability, and low costs.

However, an increased size of the transistor 12 poses a problem in that physical damage (microcracks) is likely to be caused to the impurity diffusion layer 300 of the gate electrode wiring lead-out portion 604 in the CMP process during STI formation. The physical damage degrades the film quality of the gate insulating film 500 in the subsequent thermal oxidation process and reduces withstand voltage for electric fields, leading to a gate leakage defect.

Solution of First Embodiment

Thus, in the present first embodiment, as depicted in FIG. 1A, the two protruding portions 350a and 350b are formed near the portion in which the gate electrode wiring portion 600 intersects the end portion 301 of the impurity diffusion layer 300, the protruding portions 350a and 350b protruding outward from the side surface of the impurity diffusion layer 300 including the silicon layer 320 of the semiconductor substrate.

The two protruding portions 350a and 350b each have a length of 0.4 µm or more in a direction parallel to the extension direction of the gate electrode wiring portions 600 and a length of 0.7 µm or more in a direction perpendicular to the extension direction. Each protruding portion preferably has a length of 1 µm or more in the direction parallel to the extension direction and a length of 1 µm or more in the direction perpendicular to the extension direction.

In addition, each of the two protruding portions 350a and 350b has a distance of 14 nm or more and 200 nm or less to the gate electrode wiring lead-out portion 604.

Effects of First Embodiment

As described above, according to the above-described first embodiment, the two protruding portions 350a and 350b that interpose the gate electrode wiring lead-out portion 604 therebetween are formed. Formation of the protruding portions 350a and 350b provides the end portion 301 of the impurity diffusion layer 300 with a corresponding additional area and a corresponding additional film thickness. This protects, from CMP damage, the area where the end portion 301 of the impurity diffusion layer 300 intersects the gate electrode wiring portion 600, preventing gate leakage. Thus, high reliability and high yield are achieved to enable the manufacturing costs to be reduced.

In addition, according to the first embodiment, the distance between each of the protruding portions 350a and 350b and the gate electrode wiring lead-out portion 604 is 14 nm or more and 200 nm or less. Thus, the material of the gate electrode wiring lead-out portion 604 does not remain in the protruding portions 350a and 350b. This prevents an increase in unwanted gate parasitic capacitance and suppresses dusting to achieve high reliability and high yield, allowing an increase in manufacturing costs to be suppressed.

First Modified Example of First Embodiment

Figure 22:
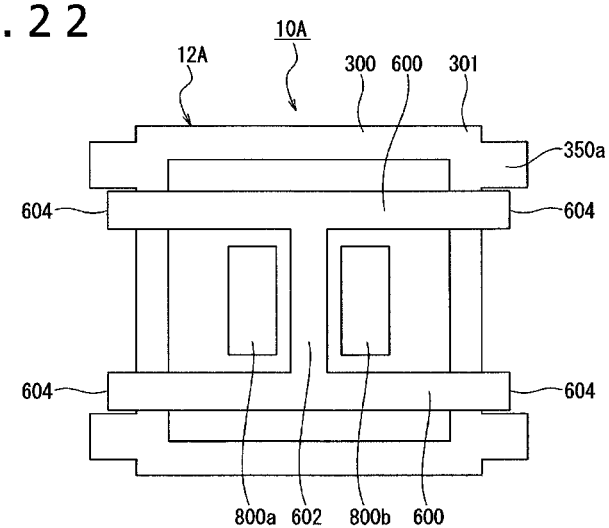
FIG. 22 is a plan view of a semiconductor apparatus according to a first modified example of the first embodiment of the present disclosure.

FIG. 22 is a plan view of a semiconductor apparatus 10A as a first modified example of the first embodiment of the present disclosure. Identical portion in FIG. 22 and described above are denoted by identical reference signs, and detailed descriptions of these portions are omitted.

A transistor 12A forms the gate electrode portion 602 and the gate electrode wiring lead-out portion 604 corresponding to a lead-out portion of the gate electrode wiring portion 600. In addition, the transistor 12A forms one protruding portion 350a near the portion in which the gate electrode wiring portion 600 intersects the end portion 301 of the transistor 12A, the protruding portion 350a protruding outward from the side surface of the impurity diffusion layer 300 including the silicon layer 320 of the semiconductor substrate. In the first modified example, in a case where two or more gate electrode wiring lead-out portions 604 are disposed parallel to each other, the protruding portion 350a is formed opposite to end portions of the gate electrode wiring lead-out portions 604 facing each other, in other words, formed outside the gate electrode wiring lead-out portions 604.

The first modified example as described above also produces effects similar to those of the above-described first embodiment.

Second Modified Example of First Embodiment

FIGS. 23A, 23B, 23C and 23D is a are plan views of a semiconductor apparatus 10B as a second modified example of the first embodiment of the present disclosure. Identical portion in FIGS. 23A, 23B, 23C, 23D, and described above are denoted by identical reference signs, and detailed descriptions of these portions are omitted.

Figures 23A, 23B:
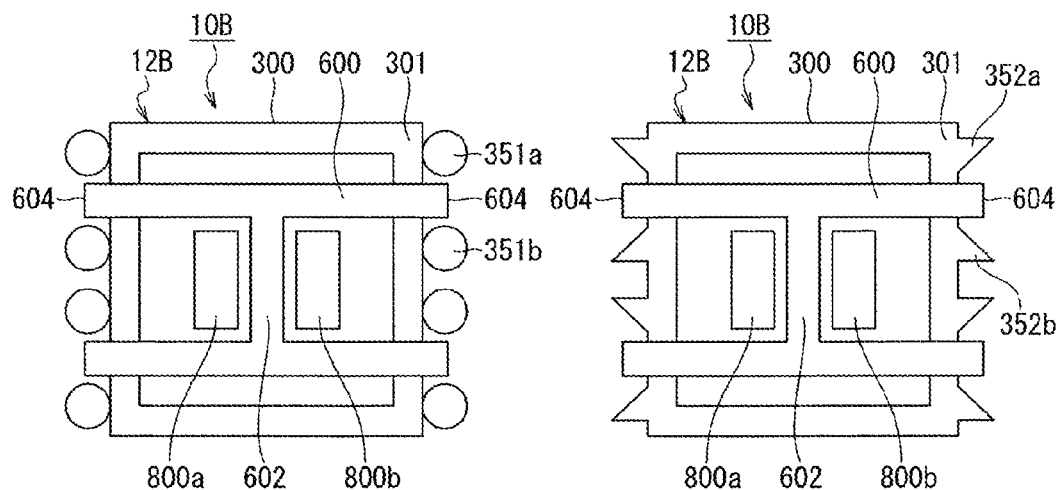
FIGS. 23A, 23B, 23C, and 23D illustrate plan views (a), (b), (c), and (d) of semiconductor apparatuses according to a second modified example of the first embodiment of the present disclosure.
Figures 23C, 23D:
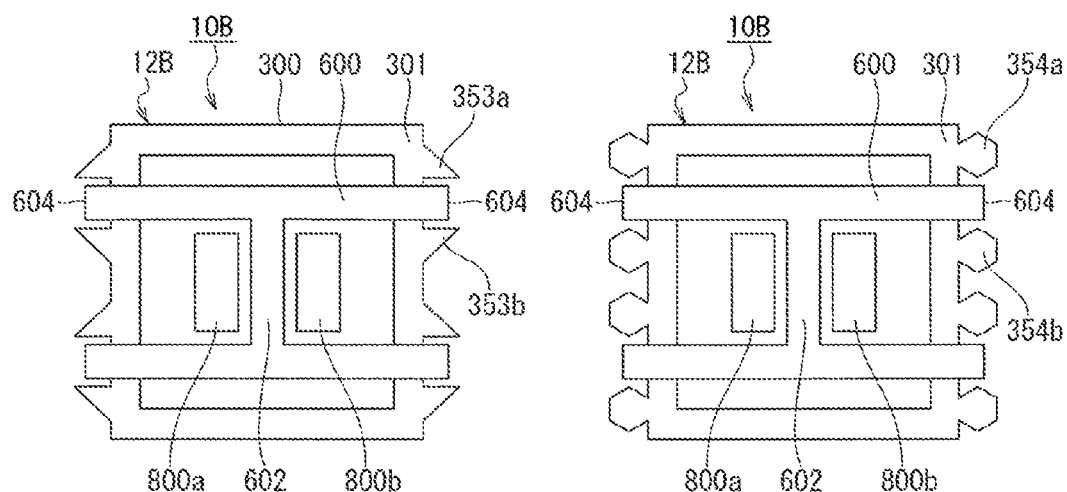

In FIG. 23A, a transistor 12B forms two protruding portions 351a and 351b near the portion in which the gate electrode wiring portion 600 intersects the end portion 301 of the transistor 12B, the protruding portions 351a and 351b protruding outward from the side surface of the impurity diffusion layer 300 including the silicon layer 320 of the semiconductor substrate. The two protruding portions 351a and 351b have a round shape as viewed from above the transistor 12B.

In addition, in FIG. 23B, the two protruding portions 352a and 352b are triangles as viewed from above the transistor 12B. In addition, in FIG. 23C, the two protruding portions 353a and 353b are triangles having different orientations from those in FIG. 23B. Further, in FIG. 23D, the two protruding portions 354a and 354b are polygons as viewed from above the transistor 12B.

The second modified example as described above also produces effects similar to those of the above-described first embodiment.

Second Embodiment

Figure 24:
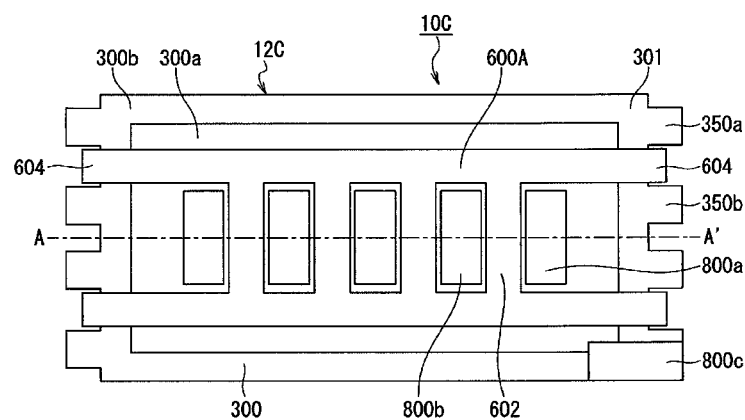
FIG. 24 is a plan view of a semiconductor apparatus according to a second embodiment of the present disclosure.

FIG. 24 is a plan view of a semiconductor apparatus 10C as a second embodiment of the present disclosure. Identical portion in FIGS. 23A, 23B, 23C, 23D, and in FIG. 1A described above are denoted by identical reference signs, and detailed descriptions of these portions are omitted. FIG.

25 is a cross-sectional view of the semiconductor apparatus 10C depicted in FIG. 24, the cross-sectional view being taken along line A-A'. Identical portions in FIG. 25 and in FIG. 2 described above are denoted by identical reference signs, and detailed descriptions of these portions are omitted.

As depicted in FIG. 24, the semiconductor apparatus 10C and a transistor 12C include a plurality of gate electrode portions 602 shaped like a ladder as viewed from above the silicon support substrate 100 and two gate electrode wiring portions 600A. In particular, the plurality of gate electrode portions 602 is arranged along the lateral direction in FIG. 24. The two gate electrode wiring portions 600A interpose the plurality of gate electrode portions 602 therebetween along the up-down direction in FIG. 24 to connect the plurality of gate electrode portions 602 together. Further, the source electrodes 800a and the drain electrodes 800b are provided in such a manner that each source electrode 800a and each drain electrode 800b interpose each gate electrode portion 602 therebetween in the lateral direction in FIG. 24.

In addition, the semiconductor apparatus 10C and the transistor 12C form two protruding portions 350a and 350b near the portion in which the gate electrode wiring portion 600A intersects the end portion 301 of the transistor 12C, the protruding portions 350a and 350b protruding outward from the side surface of the impurity diffusion layer 300 including the silicon layer 320 of the semiconductor substrate. In addition, the gate electrode wiring portion 600A forms the gate electrode wiring lead-out portion 604 extending across the end portion 301 of the transistor 12C.

Figure 25:
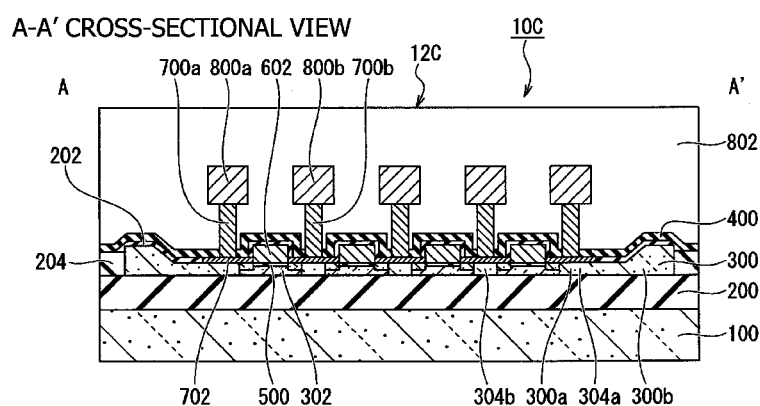
FIG. 25 is a cross-sectional view of the semiconductor apparatus depicted in FIG. 24, the cross-sectional view being taken along line A-A'.

In addition, also in the present second embodiment, as depicted in FIG. 25, the impurity diffusion layer 300 includes the thin film portion 300a located in the central portion and the thick film portions 300b located at the end portions 301 as is the case with the above-described first embodiment. In the present second embodiment as well, the gate region 302, the source region 304a, and the drain region 304b are provided in the thin film portion 300a of the impurity diffusion layer 300. As described above, even with the plurality of gate regions 302, the impurity diffusion layer 300 with the thin film portion 300a and the thick film portion 300b can be applied.

The second embodiment as described above also produces effects similar to those of the above-described first embodiment.

Third Embodiment

Figure 26:
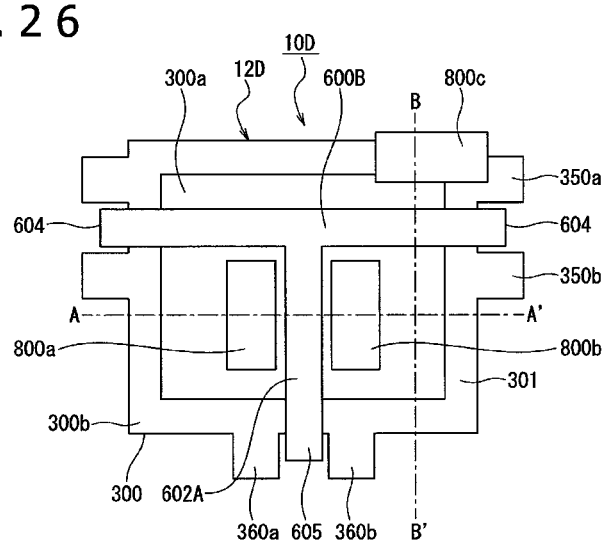
FIG. 26 is a plan view of a semiconductor apparatus according to a third embodiment of the present disclosure.
Figure 27:
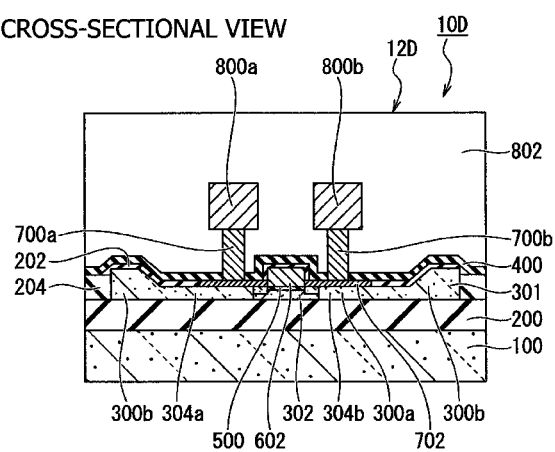
FIG. 27 is a cross-sectional view of the semiconductor apparatus depicted in FIG. 26, the cross-sectional view being taken along line A-A'.
Figure 28:
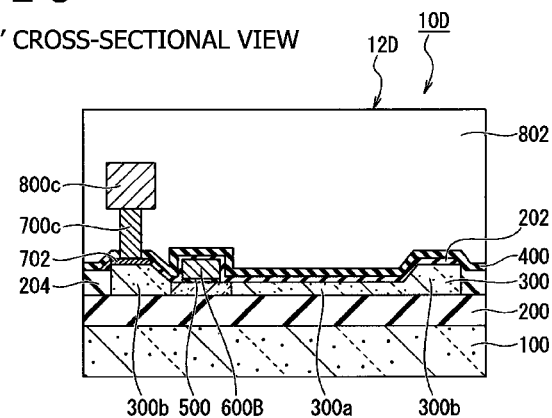
FIG. 28 is a cross-sectional view of the semiconductor apparatus depicted in FIG. 26, the cross-sectional view being taken along line B-B'.

FIG. 26 depicts a plan view of a semiconductor apparatus 10D as a third embodiment of the present disclosure. Identical portion in FIG. 26 and in FIG. 1A described above are denoted by identical reference signs, and detailed descriptions of these portions are omitted. In addition, FIG. 27 is a cross-sectional view of the semiconductor apparatus 10D depicted in FIG. 26, the cross-sectional view being taken along A-A'. Identical portions in FIG. 27 and in FIG. 2 described above are denoted by identical reference signs, and detailed descriptions of these portions are omitted. Further, FIG. 28 is a cross-sectional view of the semiconductor apparatus 10D depicted in FIG. 26, the cross-sectional view being taken along B-B'. Identical portions in FIG. 28 and in FIG. 4 described above are denoted by identical reference signs, and detailed descriptions of these portions are omitted.

As depicted in FIG. 26, the semiconductor apparatus 10D according to the third embodiment includes a gate electrode wiring portion 600B and the gate electrode portion 602A that form a T shape as viewed from above the silicon support substrate 100. In particular, the gate electrode portion 602A is shaped like a rectangle extending along the up-down direction in FIG. 26. The gate electrode wiring portion 600B is a rectangular wiring portion extending along the lateral direction in FIG. 26. In addition, the source electrode 800a and the drain electrode 800b are provided interposing the gate electrode portion 602A therebetween in the lateral direction in FIG. 26.

In addition, the semiconductor apparatus 10D and the transistor 12D form two protruding portions 350a and 350b near the portion in which the gate electrode wiring portion 600B intersects the end portion 301 of the transistor 12D, the protruding portions 350a and 350b protruding outward from the side surface of the impurity diffusion layer 300 including the silicon layer 320 of the semiconductor substrate. Further, the semiconductor apparatus 10D and the transistor 12D form two protruding portions 360a and 360b near the portion in which the gate electrode portion 602A intersects the end portion 301 of the transistor 12D, the protruding portions 360a and 360b protruding outward from the side surface of the impurity diffusion layer 300 including the silicon layer 320 of the semiconductor substrate. In addition, the gate electrode portion 602A forms a gate electrode lead-out portion 605 extending across the end portion 301 of the transistor 12D.

In addition, also in the present third embodiment, as depicted in FIG. 27, the impurity diffusion layer 300 includes the thin film portion 300a located in the central portion and the thick film portions 300b located at the end portions 301 as is the case with the above-described first embodiment. In the present third embodiment as well, the gate region 302, the source region 304a, and the drain region 304b are provided in the thin film portion 300a of the impurity diffusion layer 300. As described above, even with the gate electrode wiring portion 600B and the gate electrode portion 602A forming a T shape, the impurity diffusion layer 300 with the thin film portion 300a and the thick film portion 300b can be applied.

The third embodiment as described above also produces effects similar to those of the above-described first embodiment.

Fourth Embodiment

Figure 29:
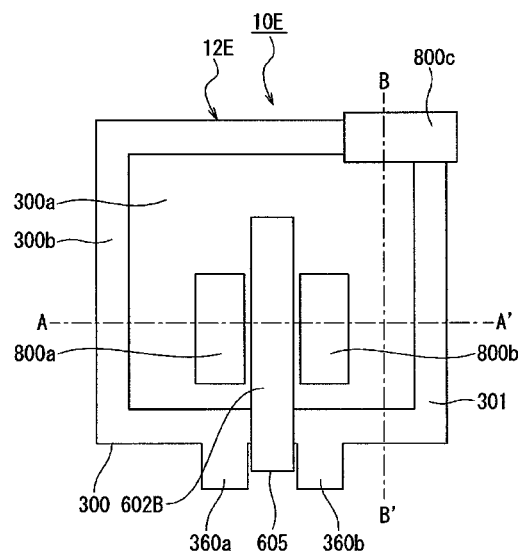
FIG. 29 is a plan view of a semiconductor apparatus according to a fourth embodiment of the present disclosure.
Figure 30:
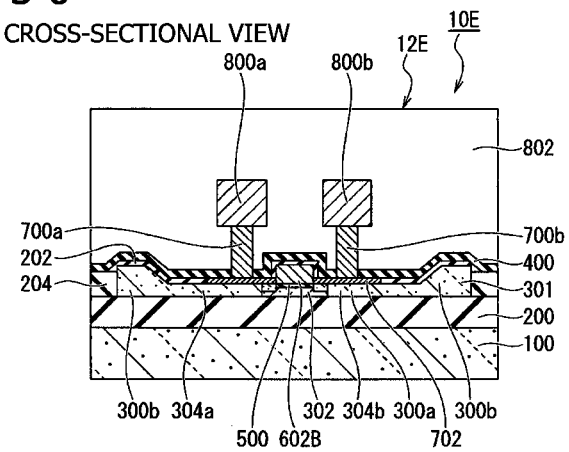
FIG. 30 is a cross-sectional view of the semiconductor apparatus depicted in FIG. 29, the cross-sectional view being taken along line A-A'.
Figure 31:
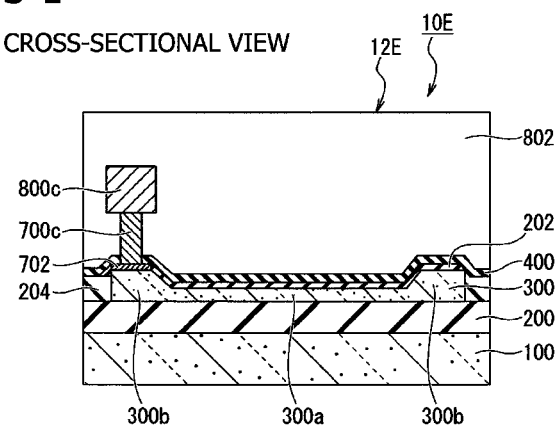
FIG. 31 is a cross-sectional view of the semiconductor apparatus depicted in FIG. 29, the cross-sectional view being taken along line B-B'.

FIG. 29 depicts a plan view of a semiconductor apparatus 10E as a fourth embodiment of the present disclosure. Identical portions in FIG. 29 and in FIG. 26 described above are denoted by identical reference signs, and detailed descriptions of these portions are omitted. In addition, FIG. 30 is a cross-sectional view of the semiconductor apparatus 10E depicted in FIG. 29, the cross-sectional view being taken along A-A'. Identical portions in FIG. 30 and in FIG. 2 described above are denoted by identical reference signs, and detailed descriptions of these portions are omitted. Further, FIG. 31 is a cross-sectional view of the semiconductor apparatus 10E depicted in FIG. 29, the cross-sectional view being taken along B-B'. Identical portions in FIG. 31 and in FIG. 4 described above are denoted by identical reference signs, and detailed descriptions of these portions are omitted.

As depicted in FIG. 29, the semiconductor apparatus 10E according to the fourth embodiment includes the gate electrode portion 602B having an I shape as viewed from above the silicon support substrate 100. In particular, the gate electrode portion 602B has a rectangular shape extending along the up-down direction in FIG. 29. Further, the source electrode 800a and the drain electrode 800b are provided interposing the gate electrode portion 602B therebetween in the lateral direction in FIG. 29.

In addition, the semiconductor apparatus 10E and the transistor 12E form two protruding portions 360a and 360b near the portion in which the gate electrode portion 602B intersects the end portion 301 of the transistor 12E, the protruding portions 360a and 360b protruding outward from the side surface of the impurity diffusion layer 300 including the silicon layer 320 of the semiconductor substrate. In addition, the gate electrode portion 602B forms the gate electrode lead-out portion 605 extending across the end portion 301 of the transistor 12E.

In addition, in the present fourth embodiment, the impurity diffusion layer 300 includes the thin film portion 300a located in the central portion and the thick film portions 300b located at the end portions 301 as is the case with the above-described first embodiment. In the present fourth embodiment, the gate region 302, the source region 304a, and the drain region 304b are provided in the thin film portion 300a of the impurity diffusion layer 300. As described above, even with the gate electrode portion 602B having an I shape, the impurity diffusion layer 300 with the thin film portion 300a and the thick film portion 300b can be applied.

The fourth embodiment as described above also produces effects similar to those of the above-described first embodiment.

Other Embodiments

As described above, the present technology has been described in conjunction with the first to fourth embodiments and the first and second modified examples of the first embodiment. However, it should not be understood that the discussions and the drawings constituting a part of the disclosure limit the present technology. By understanding the spirits of contents of the technology disclosed by the above-described first to third embodiments, those skilled in the art clearly recognize that the present technology may include various alternative embodiments, examples, and operation technologies. In addition, configurations disclosed by the first to fourth embodiments and the first and second modified examples of the first embodiment can appropriately be combined together without leading to contradiction. For example, configurations disclosed by a plurality of different embodiments may be combined together or configurations disclosed by a plurality of different modified examples of the identical embodiment may be combined together.

Note that the present disclosure can also be configured as described below.

(1)

A semiconductor apparatus including:

a substrate having a buried insulating film and a semiconductor layer provided on the buried insulating film and formed with a semiconductor element;

a gate electrode provided on the semiconductor layer and having a wiring extending from a central portion of the semiconductor layer to each end portion of the semiconductor layer in a case where the substrate is viewed from above;

a source contact via and a drain contact via which are provided on the semiconductor layer; and a protruding portion provided near an area where the end portion of the semiconductor layer intersects the wiring of the gate electrode, the protruding portion including a material identical to that of the semiconductor layer and protruding outward from a side surface of the semiconductor layer, in which at least part of the end portion of the semiconductor layer has thick film regions each having a larger film thickness than a portion of the semiconductor layer immediately below the gate electrode, and the source contact via and the drain contact via are provided in areas other than the thick film regions.

(2)

The semiconductor apparatus according to (1) described above, in which the wiring has lead-out portions extending outward from the respective end portions of the semiconductor layer, and two or more protruding portions are provided interposing the lead-out portion of the gate electrode between the protruding portions.

(3)

The semiconductor apparatus according to (1) described above, in which the wiring has lead-out portions extending outward from the respective end portions of the semiconductor layer, the lead-out portions of the gate electrode are disposed in plural in such a manner that the lead-out portions are parallel to one another, and the protruding portion is provided at an end portion opposite to an end portion at which the lead-out portions of the gate electrode face each other.

(4)

The semiconductor apparatus according to any one of (1) to (3) described above, further including:

an element isolation portion isolating the semiconductor element.

(5)

The semiconductor apparatus according to any one of (1) to (3) described above, in which the end portion of the semiconductor layer has a film thickness twice to ten times as large as a film thickness of the central portion of the semiconductor layer.

(6)

The semiconductor apparatus according to (5) described above, in which the end portion of the semiconductor layer has a film thickness of 140 nm to 200 nm, and the central portion of the semiconductor layer has a film thickness of 20 nm to 70 nm.

(7)

The semiconductor apparatus according to any one of (1) to (3) described above, in which the protruding portion protrudes 0.4 μm or more in a direction parallel to an extension direction of the wiring of the gate electrode and protrudes 0.7 μm or more in a direction perpendicular to the extension direction, or the protruding portion protrudes 1 μm or more in the direction parallel to the extension direction and protrudes 1 μm or more in the direction perpendicular to the extension direction.

(8)

The semiconductor apparatus according to (2) or (3) described above, in which a distance between the protruding portion and the lead-out portion of the gate electrode is 14 nm or more and 200 nm or less.

(9)

The semiconductor apparatus according to any one of (1) to (3) described above, in which the protruding portion has at least one shape of a quadrangle, a round shape, a triangle, and a polygon, as viewed from above the substrate.

(10)

The semiconductor apparatus according to any one of (1) to (3) described above, in which
the gate electrode has any one of an H shape, a T shape, an I shape, and a ladder shape, as viewed from above the substrate.

(11)

A manufacturing method for a semiconductor apparatus, the manufacturing method including:
forming a gate electrode on a semiconductor layer provided on a buried insulating film and formed with a semiconductor element, the gate electrode having a wiring extending from a central portion of the semiconductor layer to end portions of the semiconductor layer in a case where a substrate having the buried insulating film and the semiconductor layer is viewed from above;
forming protruding portions each located near an area where the end portion of the semiconductor layer intersects the wiring of the gate electrode, the protruding portion including a material identical to that of the semiconductor layer and protruding outward from a side surface of the semiconductor layer; and
setting the end portions of the semiconductor layer larger in film thickness than a portion of the semiconductor layer immediately below the gate electrode.

REFERENCE SIGNS LIST 10, 10A, 10B, 10C, 10D, 10E: Semiconductor apparatus
12, 12A, 12B, 12C, 12D, 12E: Transistor
100: Silicon support substrate
200: Buried insulating film
202: Silicon oxide film
204: STI (isolation insulating film)
400: Silicon nitride film
802: Silicon oxide film
300: Impurity diffusion layer (semiconductor layer)
300a: Thin film portion
300b: Thick film portion
301: End portion of transistor
302: Gate region
304a: Source region
304b: Drain region
320: Silicon layer
320a: Central portion
320b: End portion
350a, 350b, 351a, 351b, 352a, 352b, 353a, 353b, 354a, 354b,
360a, 360b: Protruding portion
500: Gate insulating film
600, 600A, 600B: Gate electrode wiring portion
602, 602A, 602B: Gate electrode portion
604: Gate electrode wiring lead-out portion
605: Gate electrode lead-out portion
700a: Source contact via
700b: Drain contact via
700c: Body contact via
702: Silicide film
800a: Source electrode
800b: Drain electrode
800c: Body contact electrode
900: Silicon oxide film
902: Silicon nitride film
904: Resist pattern
906: Opening
907: Silicon oxide film
908: Silicon thin film portion
1000: Silicon oxide film
1100: Silicon nitride film
1200: Resist film
1300: Resist pattern
1600: Opening
1400: Silicon oxide film
1500: Resist film
1700: Transistor formation region
350a', 350b': Resist pattern including protruding portion
2000: LDD layer
305a: Source N+ region
305b: Drain N+ region

The invention claimed is:

1. A semiconductor apparatus, comprising:
a substrate having a buried insulating film and a semiconductor layer provided on the buried insulating film and formed with a semiconductor element;
a gate electrode provided on the semiconductor layer and having a wiring extending from a central portion of the semiconductor layer to each end portion of the semiconductor layer in a case where the substrate is viewed from above;
a source contact via and a drain contact via which are provided on the semiconductor layer; and
a protruding portion provided near an area where the end portion of the semiconductor layer intersects the wiring of the gate electrode, the protruding portion including a material identical to that of the semiconductor layer and protruding outward from a side surface of the semiconductor layer, wherein
at least part of the end portion of the semiconductor layer has thick film regions each having a larger film thickness than a portion of the semiconductor layer immediately below the gate electrode, and
the source contact via and the drain contact via are provided in areas other than the thick film regions.

2. The semiconductor apparatus according to claim 1, wherein
the wiring has lead-out portions extending outward from respective end portions of the semiconductor layer, and
two or more protruding portions are provided interposing the lead-out portion of the gate electrode between the two or more protruding portions.

3. The semiconductor apparatus according to claim 1, wherein
the wiring has lead-out portions extending outward from respective end portions of the semiconductor layer,
the lead-out portions of the gate electrode are disposed in plural in such a manner that the lead-out portions are parallel to one another, and
the protruding portion is provided at an end portion opposite to an end portion at which the lead-out portions of the gate electrode face each other.

4. The semiconductor apparatus according to claim 1, further comprising:
an element isolation portion isolating the semiconductor element.

5. The semiconductor apparatus according to claim 1, wherein
the end portion of the semiconductor layer has a film thickness twice to ten times as large as a film thickness of the central portion of the semiconductor layer.

6. The semiconductor apparatus according to claim 5, wherein
   the end portion of the semiconductor layer has a film thickness of 140 nm to 200 nm, and
   the central portion of the semiconductor layer has a film thickness of 20 nm to 70 nm.

7. The semiconductor apparatus according to claim 1, wherein
   the protruding portion protrudes 0.4 μm or more in a direction parallel to an extension direction of the wiring of the gate electrode and protrudes 0.7 μm or more in a direction perpendicular to the extension direction, or
   the protruding portion protrudes 1 μm or more in the direction parallel to the extension direction and protrudes 1 μm or more in the direction perpendicular to the extension direction.

8. The semiconductor apparatus according to claim 2, wherein
   a distance between the protruding portion and the lead-out portion of the gate electrode is 14 nm or more and 200 nm or less.

9. The semiconductor apparatus according to claim 1, wherein
   the protruding portion has at least one shape of a quadrangle, a round shape, a triangle, and a polygon, as viewed from above the substrate.

10. The semiconductor apparatus according to claim 1, wherein
    the gate electrode has any one of an H shape, a T shape, an I shape, and a ladder shape, as viewed from above the substrate.

11. A manufacturing method for a semiconductor apparatus, the manufacturing method comprising:
    forming a gate electrode on a semiconductor layer provided on a buried insulating film and formed with a semiconductor element, the gate electrode having a wiring extending from a central portion of the semiconductor layer to end portions of the semiconductor layer in a case where a substrate having the buried insulating film and the semiconductor layer is viewed from above;
    forming protruding portions each located near an area where the end portion of the semiconductor layer intersects the wiring of the gate electrode, the protruding portion including a material identical to that of the semiconductor layer and protruding outward from a side surface of the semiconductor layer; and
    setting the end portions of the semiconductor layer larger in film thickness than a portion of the semiconductor layer immediately below the gate electrode.

* * * * *